(12) United States Patent
Ståhlberg et al.

(10) Patent No.: US 11,804,812 B2
(45) Date of Patent: *Oct. 31, 2023

(54) AUTOMATIC GAIN CONTROL

(71) Applicant: Nordic Semiconductor ASA, Trondheim (NO)

(72) Inventors: Jani Ståhlberg, Trondheim (NO); Timo Sillanpää, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 0 days.

This patent is subject to a terminal disclaimer.

(21) Appl. No.: 17/941,798

(22) Filed: Sep. 9, 2022

(65) Prior Publication Data

US 2023/0006627 A1 Jan. 5, 2023

Related U.S. Application Data

(63) Continuation of application No. 17/254,671, filed as application No. PCT/EP2019/067017 on Jun. 26, 2019, now Pat. No. 11,476,818.

(30) Foreign Application Priority Data

Jun. 27, 2018 (GB) ..................................... 1810537

(51) Int. Cl.
*H04B 1/00* (2006.01)
*H04B 1/40* (2015.01)
(Continued)

(52) U.S. Cl.
CPC ............. *H03G 3/3036* (2013.01); *H03F 3/19* (2013.01); *H04B 1/0057* (2013.01); *H04B 1/40* (2013.01);
(Continued)

(58) Field of Classification Search
CPC ... H03F 3/19; H03F 2200/451; H04B 1/0057; H04B 1/40; H04B 1/715;
(Continued)

(56) References Cited

U.S. PATENT DOCUMENTS 5,646,963 A 7/1997 Dent
11,476,818 B2 * 10/2022 Ståhlberg ............. H03G 3/3036
(Continued)

FOREIGN PATENT DOCUMENTS

EP 0 366 025 A2 10/1989
EP 1 583 232 A2 10/2005
(Continued)

OTHER PUBLICATIONS

International Search Report and Written Opinion for PCT/EP2019/067017, dated Sep. 20, 2019, 15 pages.
(Continued)

*Primary Examiner* — Jaison Joseph
(74) *Attorney, Agent, or Firm* — Klarquist Sparkman, LLP

(57) ABSTRACT

A method of operating a radio receiver device comprises receiving a plurality of signals with a plurality of corresponding frequencies; applying respective gains to each of the plurality of signals; and storing the gain applied to each signal and its corresponding frequency. The method comprises subsequently receiving a further signal with a further frequency; and applying a further gain to the further signal. The further gain is determined using at least one of the stored gains according to a difference between the further frequency and at least one of the plurality of corresponding frequencies.

18 Claims, 3 Drawing Sheets

(51) Int. Cl.
*H03G 3/30* (2006.01)
*H03F 3/19* (2006.01)
*H04B 1/715* (2011.01)

(52) U.S. Cl.
CPC ....... *H04B 1/715* (2013.01); *H03F 2200/451* (2013.01); *H03G 2201/103* (2013.01); *H03G 2201/307* (2013.01); *H04B 2001/7152* (2013.01)

(58) Field of Classification Search
CPC ..... H04B 2001/7152; H03G 2201/103; H03G 2201/307
See application file for complete search history.

(56) References Cited

U.S. PATENT DOCUMENTS

| | | | | |
|---|---|---|---|---|
| 2007/0076783 | A1* | 4/2007 | Dishman | H03G 3/3089 375/345 |
| 2007/0254692 | A1* | 11/2007 | McCoy | H04B 1/38 455/553.1 |
| 2010/0046679 | A1* | 2/2010 | Kajakine | H03G 3/3068 375/345 |
| 2011/0007780 | A1* | 1/2011 | Shimoni | H04L 27/22 375/345 |
| 2015/0146677 | A1* | 5/2015 | Ito | H04W 72/23 370/329 |
| 2021/0226598 | A1* | 7/2021 | Ståhlberg | H04B 1/40 |

FOREIGN PATENT DOCUMENTS

| | | |
|---|---|---|
| EP | 1 993 204 A1 | 11/2008 |
| JP | H09 284071 A | 10/1997 |
| JP | 2006-229739 A | 8/2006 |
| WO | WO 2014/201688 A1 | 12/2014 |

OTHER PUBLICATIONS

IPO Search Report under Section 17(5) for GB1810537.9, dated Dec. 21, 2018, 4 pages.

* cited by examiner

AUTOMATIC GAIN CONTROL

CROSS REFERENCE TO RELATED APPLICATIONS

This is a continuation of U.S. application Ser. No. 17/254,671, filed Dec. 21, 2020, which is a U.S. National Stage of International Application No. PCT/EP2019/067017, filed Jun. 26, 2019, which was published in English under PCT Article 21(2), which in turn claims the benefit of Great Britain Application No. 1810537.9, filed Jun. 27, 2018.

The present invention relates to automatic gain control systems in radio receiver devices.

Throughout the course of recent years, the extent and technical capabilities of cellular-based radio communication systems have expanded dramatically. A number of different cellular-based networks have been developed over the years, including the Global System for Mobile Communications (GSM), General Packet Radio Services (GPRS), Enhanced Data rates for GSM Evolution (EDGE), and Universal Mobile Telecommunications System (UMTS), where GSM, GPRS, and EDGE are often referred to as second generation (or "2G") networks and UMTS is referred to as a third generation (or "3G") network.

More recently, the Long Term Evolution (LTE) network, a fourth generation (or "4G") network standard specified by the $3^{rd}$ Generation Partnership Project (3GPP), has gained popularity due to its relatively high uplink and downlink speeds and larger network capacity compared to earlier 2G and 3G networks. More accurately, LTE is the access part of the Evolved Packet System (EPS), a purely Internet Protocol (IP) based communication technology in which both real-time services (e.g. voice) and data services are carried by the IP protocol.

However, while "classic" LTE connections are becoming increasingly prevalent in the telecommunications industry, further developments to the communication standard are being made in order to facilitate the so-called "Internet of Things" (IoT), a common name for the inter-networking of physical devices, sometimes called "smart devices", providing physical objects that may not have been connected to any network in the past with the ability to communicate with other physical and/or virtual objects. Such smart devices include: vehicles; buildings; household appliances, lighting, and heating (e.g. for home automation); and medical devices. These smart devices are typically real-world objects with embedded electronics, software, sensors, actuators, and network connectivity, thus allowing them to collect, share, and act upon data. These devices may communicate with user devices (e.g. interfacing with a user's smartphone) and/or with other smart devices, thus providing "machine-to-machine" (or "machine type") communication. However, the development of the LTE standards makes it more practical for them to connect directly to the cellular network.

3GPP have specified two versions of LTE for such purposes in Release 13 of the LTE standard. The first of these is called "NarrowBand IoT" (NB-IoT), sometimes referred to as "LTE Cat NB1", and the second is called "enhanced Machine Type Communication" (eMTC), sometimes referred to as "LTE Cat M1". It is envisaged that the number of devices that utilise at least one of these standards for IoT purposes will grow dramatically in the near future.

From a communications perspective, LTE standards (including NB-IoT and eMTC) use orthogonal frequency division multiple access (OFDMA) as the basis for allocating network resources. This allows the available bandwidth to be shared between user equipment (UE) that accesses the network in a given cell, provided by a base station, referred to in LTE as an "enhanced node B", "eNodeB", or simply "eNB". OFDMA is a multi-user variant of orthogonal division multiplexing (OFDM), a multiplexing scheme in which the total bandwidth is divided into a number of non-overlapping sub-bands, each having its own sub-carrier frequency. In OFDM, unlike other frequency division multiplexing (FDM) schemes, each of these sub-carriers are orthogonal to one another such that cross-talk between sub-bands is ideally eliminated and removing the need for inter-carrier guard bands.

At the physical layer, in the downlink of an LTE connection, each data frame is 10 ms long and is constructed from ten sub-frames, each of 1 ms duration. Each sub-frame contains two slots of equal length, i.e. two 0.5 ms slots. Each slot (and by extension, each sub-frame and each frame) will typically contain a certain number of "resource blocks" (where each sub-frame has twice as many resource-blocks as a slot and each frame has ten times as many resource blocks as a sub-frame). A resource block is 0.5 ms long in the time domain and is twelve sub-carriers wide in the frequency domain. Generally speaking, there are seven OFDM symbols per slot and thus fourteen OFDM symbols per sub-frame. These resource blocks can be visualised as a grid of "resource elements", where each resource element is $\frac{1}{14}$ ms long and one sub-carrier wide, such that there are eighty-four resource elements per resource block (i.e. seven multiplied by twelve) and one hundred and sixty-eight resource elements per sub-frame.

The exact number of resource blocks that exist in each slot (and by extension, each sub-frame and each frame) depends on the bandwidth configuration of the radio communication system. For example, in LTE eMTC Release 13, the LTE radio channel may have a bandwidth of 1.4 MHz, 3 MHz, 5 MHz, 10 MHz, or 20 MHz, where the channel is divided up into narrowbands of 1.4 MHz width.

In accordance with the standards set by 3GPP, many networks employ frequency hopping to mitigate the impact of interference within a specific frequency band, where the transmission narrowband is changed periodically, typically following a pattern known in advance by the UEs. In the extreme case, the narrowband could be changed as often as every sub-frame.

LTE signals detected by UEs are amplified to allow the receiver's circuitry to perform accurate demodulation. The amplified signals are passed to an analogue-to-digital converter (ADC) and onto a baseband processor for demodulation and further processing. The amount of amplification (gain) applied to the signals is selected to optimise the operational range of the ADC and/or other circuitry of the UE.

However, the strength of signals received by the UE may vary, dependent on numerous factors such as the distance to and power output of a base station, the frequency at which the signals are transmitted and the environmental surroundings of the receiver. As mentioned above, ADCs typically operate optimally when input signals are contained within a certain operational range. Signals input to the ADC with too low power may produce a low quality ADC output that does not fully utilise the resolution of the ADC, while signals with too high power may saturate the ADC. Both of these can cause result in demodulation errors.

To alleviate this problem, automatic gain control (AGC) is utilised, wherein the level of amplification applied to incoming signals is varied in accordance with their strength, to produce an optimal input to the ADC. This is often performed by implementing a feedback loop from the baseband module. When the average power of the ADC signal is too high, the baseband instructs the gain of an amplifier stage to be reduced, and vice versa. This feedback loop, however, cannot react instantaneously to changing gain requirements (i.e. there is an adjustment period after a new signal arrives before an optimal gain is applied to it).

Furthermore, frequency hopping in LTE systems means the narrowband in which signals are received can frequently change. While the narrowbands are close together in frequency (each narrowband being 1.4 MHz wide), the frequencies of signals in different narrowbands are sufficiently different that they may still experience notable differential absorption and/or different multi-path fade effects, causing significant variation in their received signal strength. The gain requirements for a frequency hopping LTE signal can thus change significantly (as the signal hops to a different narrowband) as often as every sub-frame. The inherent delay in adjusting the gain using a conventional AGC feedback loop in such scenarios can lead to a sub-optimal gain being applied to an incoming signal for a significant portion of a reception window. An alternative approach would therefore be beneficial.

When viewed from a first aspect the invention provides a method of operating a radio receiver device comprising:
receiving a plurality of signals with a plurality of corresponding frequencies;
applying respective gains to each of the plurality of signals; and
storing the gain applied to each signal and its corresponding frequency;
wherein the method comprises subsequently:
receiving a further signal with a further frequency; and
applying a further gain to the further signal;
wherein the further gain is determined using at least one of the stored gains according to a difference between the further frequency and at least one of the plurality of corresponding frequencies.

This it will be seen by those skilled in the art that in accordance with at least embodiments of the present invention, the most appropriate of a number of previously stored gains can be used. Selecting the further gain using at least one of the stored gains reduces the likelihood of an inappropriate gain being applied to the further signal, reducing the risk of demodulation errors and data loss and, thus, increasing the reliability of the transceiver.

The further gain, which comprises an initial estimate of the optimal gain for the further signal, may be applied immediately to the further signal, without having to wait for feedback to inform the choice of gain. There is, therefore, no initial adjustment period of the type present in conventional AGC's when the further signal is received in which an inappropriate gain may be applied, as may arise with conventional AGC system as the system adjusts to the new gain requirements. In addition, determining the further gain using at least one of the stored gains enables an optimal gain for the further signal to be obtained more quickly when used alongside a conventional AGC feedback loop, as the determined gain is likely to be nearer to the optimal value to start with.

In some embodiments applying respective gains to each of the plurality of signals may comprise optimising the respective gains using automatic gain control (e.g. using an AGC feedback loop). In such embodiments the plurality of stored gains comprises a plurality of stored optimised gains (i.e. the stored gains are updated as the gain is optimised). Optimising the respective gains may comprise determining a measure of strength of each signal of the plurality of signals after they have been amplified (e.g. by measuring the average amplitude of the amplified signal). These measures may then be compared to a target and the gain adjusted so as to achieve the target measure of strength.

In some embodiments the further gain may be set to be equal to a stored gain with a corresponding frequency that is a closest of the plurality of corresponding frequencies to the further frequency (i.e. a frequency separation between further frequency and a corresponding frequency is minimised). Preferably, the further gain is set to be equal to a stored gain with a corresponding frequency that is substantially equal to the further frequency (e.g. where the corresponding frequency is within a same frequency band as the further frequency). Because two signals with substantially identical frequencies experience similar if not identical frequency-dependent effects on signal strength (e.g. multi-path effects and/or frequency dependent attenuation), an optimal gain applied to a previously-received signal with a frequency similar to the further signal is likely to be similar to or even equal to the optimal gain for the further signal.

The Applicant has recognised, however, that basing the further gain solely upon the frequency difference between the further signal and a previously received signal may not necessarily result in a reasonable estimate of the optimal gain for the further signal, especially in cases when the previously received signal was received a long time prior to the reception of the further signal. In such scenarios it is likely that one or more environmental conditions will have changed between the two signals being received, causing a shift in gain requirements. In this case, even a gain used for a signal with an identical frequency to the further frequency may not comprise a good estimate of the optimal gain for the further signal.

In some embodiments, therefore, the method may further comprise storing in the memory respective times at which each stored gain was applied to a respective signal. In some such embodiments, the method may comprise determining the further gain according to a comparison between a time at which the further signal is received and the respective stored time.

For example, all stored gains which were applied at a time before a threshold may be disregarded, and the further gain then set to be equal to one of the remaining stored gains with a corresponding frequency that is closest to the further frequency or simply equal to the stored gain applied most recently. This prevents the use of stored gains which are no longer appropriate due to long-term changes in signal strength (e.g. due a transceiver moving relative to a base station or a significant change in environmental conditions).

In some embodiments, all stored gains with a corresponding frequency that differs from the further frequency by more than a threshold value may be disregarded, and the further gain set to be equal to the most recently applied of the remaining gains.

This may prevent the use of gains which are not applicable due to significant frequency-dependent attenuation (e.g. interference specific to a small band of frequencies).

In some embodiments each previously-applied gain (and its corresponding frequency and time) may be assigned a distance metric based upon its difference in both frequency and time from the further signal. This distance metric may comprise a weighted combination of the differences. The further gain may then be set to be equal to the gain to which the minimum distance metric has been assigned. By adjusting the weightings of the frequency and time separation in the distance metric calculation one may be prioritised whilst both are still taken into account. Taking both time and frequency separation into account may enable a more optimal further gain to be determined. The weightings applied to the frequency and time separation may be determined based upon an application of the transceiver. For example, a transceiver that it is likely to experience a lot of movement relative to a base station (e.g. in a vehicle) may be configured to prioritise minimising the time separation over the frequency separation, as gain values in for any frequency are likely to become inapplicable quickly as the transceiver moves and the distance to the base station changes, overwhelming any subtle frequency-dependent variations.

Contrastingly, a transceiver that it is likely to remain stationary for long periods of time such as a static sensor may prioritise minimising the frequency separation, as time-dependent changes in gain requirements are likely to be small in such an application.

It is envisaged of course that a combination of distance metrics and thresholds could be used (which might be seen as 'zero weighting' larger distances in frequency and/or time).

While in the above embodiments the further gain is determined to be equal to a previously-applied gain which best satisfies various criteria (e.g. minimum frequency or time separation), this is not always necessary. For example, in any of the embodiments described above, the further gain may be derived from one or more stored gains but subject to a refinement according to a frequency separation and/or time separation between the stored gain and the further gain.

In some embodiments the further gain may be set to a value interpolated between two or more stored gains. For example, a first stored gain may have a corresponding frequency which is 100 kHz higher than the further frequency, and a second stored gain may have a corresponding frequency which is 100 kHz lower than the further frequency. In such an example the further gain may be set to an average of the first and second stored gains.

The "frequency" of a signal should be understood not to be limited to one specific frequency (i.e. a specific Hz value), but instead may refer a frequency band within which the signal lies (i.e. a range of frequencies). In such cases, the difference between the further frequency and the plurality of frequencies may comprise a number of frequency bands between a further frequency band (in which the further signal lies) and a plurality of frequency bands. The plurality of signals (and the further signal) may comprise signals transmitted according to an LTE standard and preferably according to an eMTC standard. The plurality of frequencies (and the further frequency) may comprise a plurality of narrowbands defined according to an LTE standard.

The invention extends to a radio transceiver device comprising:
  an antenna;
  an amplifier module; and
  a memory;
wherein the device is configured to:
  receive a plurality of signals with a plurality of corresponding frequencies;
  apply respective gains to each of the plurality of signals using the amplifier; and
  store each gain and its corresponding frequency in the memory;
wherein the device is configured to receive subsequently a further signal with a further frequency and to apply a further gain to said further signal using the amplifier;
wherein the further gain is determined using at least one of the stored gains according to a difference between the further frequency and the plurality of corresponding frequencies.

Preferably, the radio transceiver device comprises an eMTC radio transceiver device which operates according to an LTE standard.

The amplifier module may comprise an adjustable gain low noise amplifier.

The device may further comprise a digital signal processor arranged to optimise the respective gains using automatic gain control.

The device may be configured to operate in accordance with any of the method features set out hereinabove.

One or more non-limiting examples of the present disclosure will now be described with reference to the accompanying Figures, in which.

Figure 1:
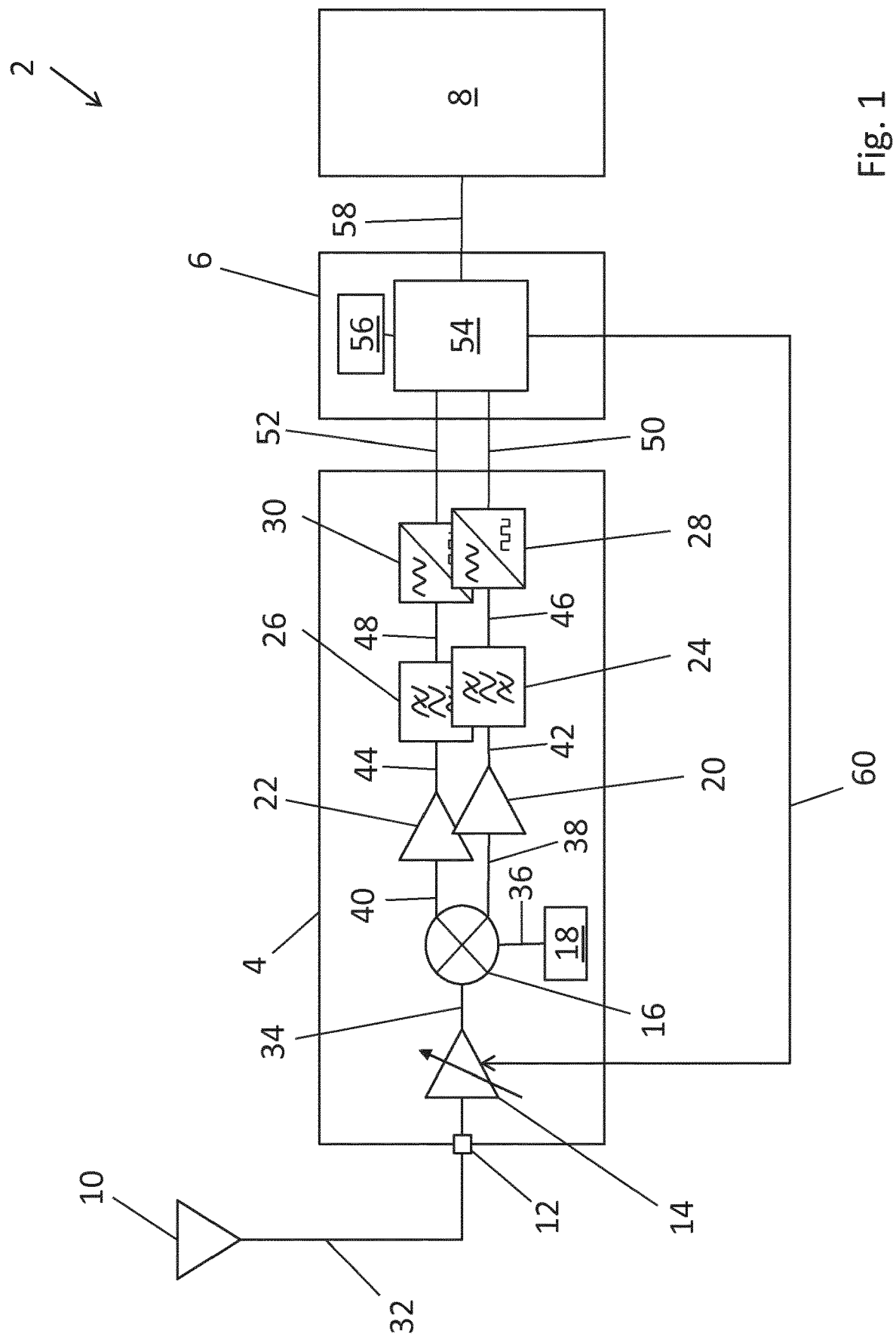
FIG. 1 is a block diagram of an eMTC radio receiver device according to an embodiment of the present invention.

FIG. 1 shows an eMTC radio receiver device 2. The receiver 2 is implemented as a system-on-chip (SoC) and comprises: an analogue RF front-end circuit portion 4; a digital circuit portion 6; and a baseband circuit portion 8. The structure and operation of each of these circuit portions 4, 6, 8 are described in turn below.

The analogue RF front-end circuit portion 4 is arranged to be connected to an antenna 10 via an antenna terminal 12 for receiving LTE eMTC radio signals received over-the-air. The analogue circuit portion 4 comprises: a variable gain pre-amplifier 14; a mixer 16; a local oscillator 18; an in-phase amplifier 20; a quadrature amplifier 22; two band-pass filters 24, 26; an in-phase ADC 28, and a quadrature ADC 30.

When an incoming LTE radio signal 32 is received via the antenna 10, it is first input to the variable gain pre-amplifier 14 which amplifies the signal 32 to a level suitable for processing by downstream circuitry. Typically, the variable gain pre-amplifier 14 is a low-noise amplifier (LNA), a type of amplifier known in the art per se that is particularly suited to amplifying a signal of interest while rejecting unwanted noise.

The resulting amplified signal 34 is input to the mixer 16, which is also arranged to receive a signal 36 generated by the local oscillator 18 as a further input. The signal 36 generated by the local oscillator 18 is set to the frequency of interest (i.e. the carrier frequency associated with the channel to which the receiver 2 is currently tuned). This down-mixes the amplified signal 34 to baseband and generates an in-phase signal 38 and a quadrature signal 40.

The in-phase signal 38 and the quadrature signal 40 are passed through the in-phase amplifier 20 and the quadrature amplifier 22 respectively to provide further amplification of each of these signals 38, 40. The resulting amplified in-phase signal 42 and amplified quadrature signal 44 are each passed through a respective band-pass filter 24, 26, where the bandpass filters 24, 26 are tuned to reject signals outside a particular frequency range. This results in a filtered in-phase signal 46 and a filtered quadrature signal 48.

The filtered in-phase and quadrature signals 46, 48 are input to the in-phase ADC 28 and the quadrature ADC 30 respectively. These ADCs 28, 30 convert the analogue filtered signals 46, 48 to a digital in-phase signal 50 and a digital quadrature signal 52. The resulting digital signals 50, 52 are then input to the digital circuit portion 6.

The digital circuit portion 6 includes a processor 54 which is connected to a memory 56. The processor is arranged to carry out digital processing of the digital signals 50, 52 in order to decode them, i.e. to retrieve the data within the received sub-frame. Once the processor 54 decodes the received eMTC sub-frame, the resulting data 58 is passed to the downstream baseband circuitry 8, which will use the data for the desired application.

The strength of the incoming LTE radio signal 32 can vary significantly for a multitude of reasons, including a changing distance to a base station or local environmental effects (e.g. interference or signal attenuation by intervening objects). The digital circuit portion 6 is, therefore, further configured to provide automated gain control (AGC) to the receiver 2. This is provided by the digital circuit portion estimating the amplitudes of the filtered in-phase and quadrature signals 46, 48 using the digital signals 50, 52 from the ADCs 28, 30. The digital circuit portion 6 uses this estimation to provide a control signal 60 the variable gain pre-amplifier 14 to maximise the utilisation of the dynamic range of the ADCs 28, 30 (while avoiding saturating the ADCs 28, 30) for any strength of incoming signal 32.

For instance, if the incoming signal 32 is weak, such that the estimated amplitudes of the filtered in-phase and quadrature signals 46, 48 are below a maximum input amplitude of the ADCs 28, 30, the digital circuit portion 6 provides a control signal 60 which increases the gain provided by the variable gain pre-amplifier 14. This increases the amplitudes of the filtered in-phase and quadrature signals 46, 48, increasing the utilisation of the ADCs' 28, 30 dynamic range and thus the resolution of their outputs 50, 52. Contrastingly, if the incoming signal 32 is strong, such that estimated amplitudes of the filtered in-phase and quadrature signals 46, 48 are so large as to saturate the ADCs 28, 30, the digital circuit portion 6 provides a control signal 60 which decreases the gain provided by the variable gain pre-amplifier 14. This reduces the likelihood of data being lost during the analogue to digital conversion.

Operation of the receiver 2 in accordance with an embodiment of the present invention will now be described with further reference to FIG. 2.

The LTE eMTC radio signals received by the receiver 2 are transmitted within one of eight 1.4 MHz narrowbands 200-207 (which make up a 10 MHz LTE radio channel). The narrowband 200-207 within which the signals are transmitted is changed periodically, following a pseudo-random pattern known in advance by the receiver 2. This is known as frequency hopping.

Figure 2:
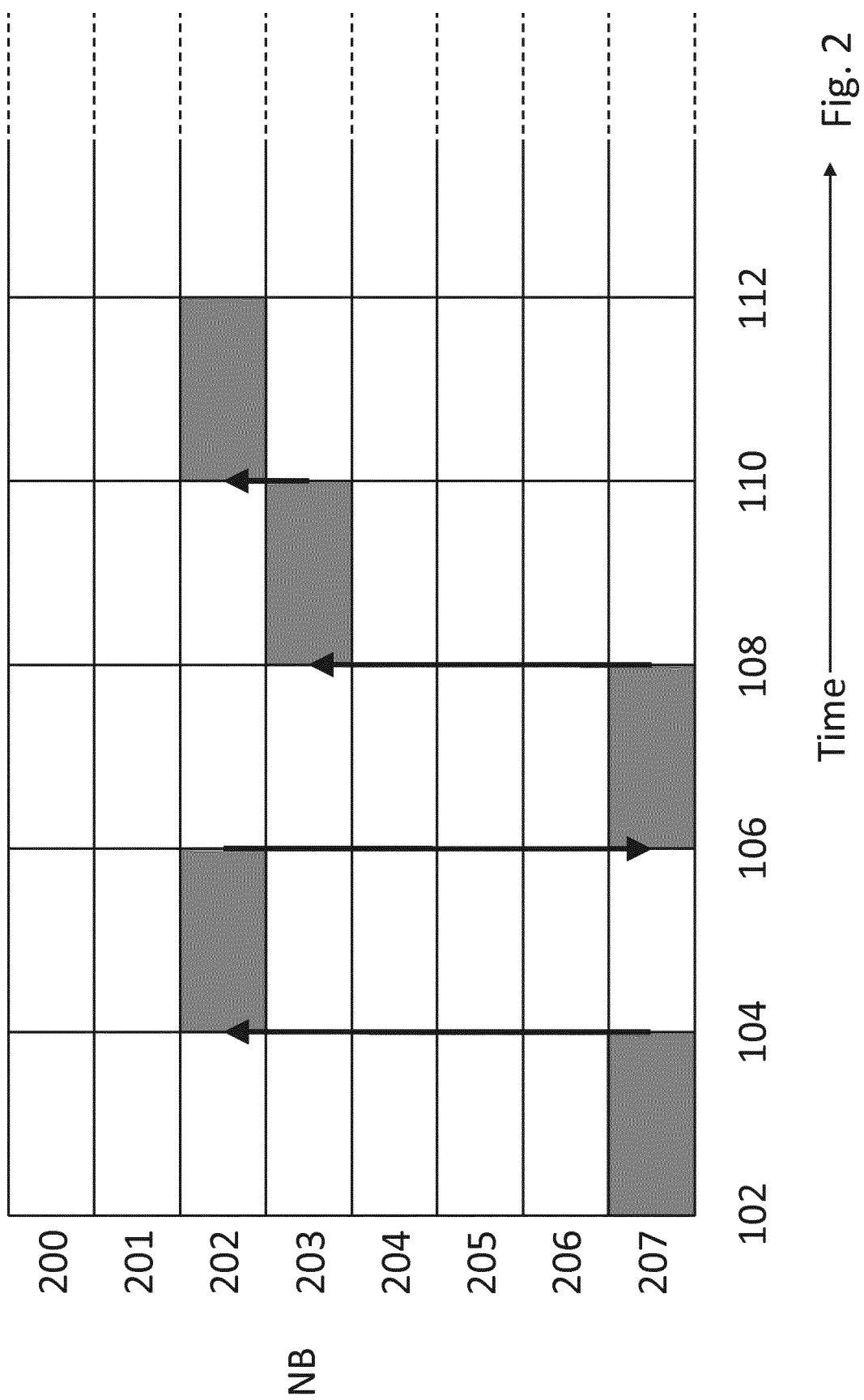
FIG. 2 is a timing diagram illustrating frequency hopping within an LTE signal.

This frequency hopping behaviour is shown in FIG. 2, which is a timing diagram showing the active narrowband over time. At an initial time 102 the LTE radio signal 32 is transmitted in a seventh narrowband 207. At the end of a first sub-frame, at time 104, the signal 32 hops to a second narrowband 202. At time 106 the signal 32 hops back to the seventh narrowband 207. At time 108 the signal 32 hops to a third narrowband 203 and then at time 110 the signal 32 hops back to the second narrowband 202.

The strength of the signal 32 received by the receiver 2 varies with time (e.g. due to movement of a receiver relative to a base station, or changing environmental conditions) but also with the changing narrowbands 200-207 in which it is transmitted (e.g. due to varying multi-path effects or frequency-dependent attenuation). As such, to achieve optimal operation, a different gain needs to be applied by the pre-amplifier 14 as the transmission narrowband 200-207 changes. The conventional automatic gain control provided by the digital circuit portion 6 to the pre-amplifier 14 operates using feedback from the ADCs 28, 30 and thus features an inherent delay. As such, it cannot react immediately to changing gain requirements as the active narrowband 200-207 changes. As explained above, this may result in sub-optimal operation or even lost data.

Figure 3:
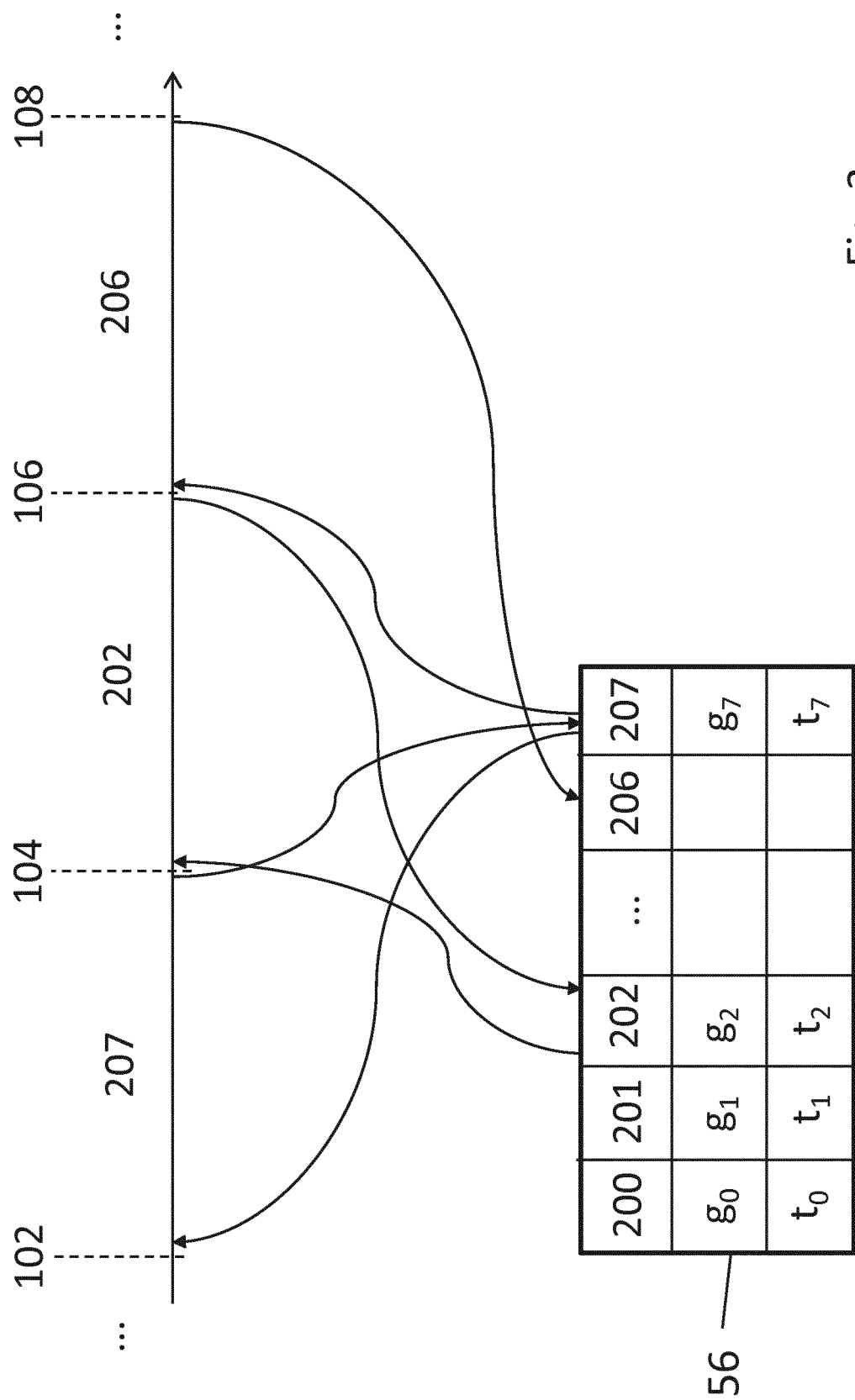
FIG. 3 is a timing diagram illustrating operation of the eMTC radio device shown in FIG. 1.

The digital circuit portion 6 is configured to mitigate this delay by applying immediately an estimated gain when the signal 32 hops to a different narrowband 200-207, as will be explained in more detail below with reference to FIG. 3.

Every time the signal 32 hops from one narrowband 200-207 to another (i.e. at times 102, 104, 106 and 108), the gain applied by the pre-amplifier 14 to the signal is recorded in the memory 56, along with the current time and the narrowband for which that gain was applied. A new gain, selected for the narrowband to which the signal 32 is hopping, is then applied.

As mentioned above and as shown in FIG. 3, at the initial time 102 the transceiver 2 receives a signal on the seventh narrowband 207. The digital circuit portion 6 reads a gain $g_7$ from the memory 56 which had been previously applied to a signal on the seventh narrowband 207 at a time $t_7$ and instructs the pre-amplifier 14 to apply this gain to the incoming signal 32. Between times 102 and 104 the signal 32 is demodulated and data extracted. Throughout this period the digital circuit portion 6 refines the gain applied by the pre-amplifier 14 based upon feedback from the ADCs 28, 30.

At time 104 the digital circuit portion 6 stores the refined value of the gain $g_7$ for the seventh narrowband 207 in the memory 56 (i.e. the value of $g_7$ stored in the memory is updated). The digital circuit portion 6 also updates the time $t_7$ to equal the time 104 at which the refined gain $g_7$ was applied. The signal 32 hops to the second narrowband 202 and the digital circuit portion 6 retrieves a gain $g_2$ from the memory 56 which had been previously applied to a signal on the second narrowband 202 at a time $t_2$. This gain is applied immediately to the signal 32 by the pre-amplifier 14.

At time 106 the signal 32 hops to the sixth narrowband 206. However, the receiver has not received a signal 32 in the sixth narrowband 206 before and as such, there is not yet a value for the gain to be applied stored in the memory 56. However, instead of continuing to use the gain $g_2$ which was applied to the signal 32 in the second narrowband 202, the digital signal processor 6 reads the (previously updated) gain $g_7$ from the memory 56 and applies it to the signal 32.

While the gain $g_7$ used for the seventh narrowband 207 may not be optimal for the signal 32 in the sixth narrowband 206, it is likely to be closer than the gain $g_2$ used for the second narrowband 202, as the frequency difference between the sixth and seventh narrowbands 206, 207 is much less than that between the sixth and second narrowbands 206, 202. Gain $g_7$ therefore serves as the best estimate the digital signal processor 6 can make of the optimal gain for the sixth narrowband 206 at time 106.

Alternatively, the digital signal processor 6 may interpolate between two (or more) previously stored gains to determine an estimate for the gain to be applied to the signal 32 in the sixth narrowband 206. For example, the gain for the sixth narrowband 206 may be calculated as a weighted average of $g_7$ and $g_2$ (e.g. $0.8 \times g_7 + 0.2 \times g_2$)— with the weights being calculated, for example, according to how recently $g_7$ and $g_2$ were stored.

As described above, the gain $g_6$ applied to the sixth narrowband is refined over time by feedback from the ADCs 28, 30. At time 108, the signal 32 hops to another narrowband, and a refined gain $g_6$ for the sixth narrowband is stored in the memory 56, along with the time $t_6$.

The invention claimed is:

1. A method of operating a radio receiver device comprising:
   receiving a plurality of signals with a plurality of corresponding frequencies;
   applying respective gains to each of the plurality of signals; and
   storing the gain applied to each signal, its corresponding frequency, and a time at which the gain was applied;
   wherein the method comprises subsequently:
   receiving a further signal with a further frequency; and
   applying a further gain to the further signal;
   wherein the further gain is determined using at least one of the stored gains according to a difference between the further frequency and at least one of the plurality of corresponding frequencies and according to a comparison between a time at which the further signal is received and at least one of the stored times.

2. The method of operating a radio receiver device as claimed in claim 1, wherein applying respective gains to each of the plurality of signals comprises optimising the respective gains using automatic gain control.

3. The method of operating a radio receiver device as claimed in claim 1, comprising setting the further gain to be equal to a stored gain with a corresponding frequency that is a closest of the plurality of corresponding frequencies to the further frequency.

4. The method of operating a radio receiver device as claimed in claim 1, comprising disregarding all stored gains with a corresponding frequency that differs from the further frequency by more than a threshold value.

5. The method of operating a radio receiver device as claimed in claim 1, comprising assigning each previously-applied gain a distance metric based upon its difference in both frequency and time from the further signal.

6. The method of operating a radio receiver device as claimed in claim 5, wherein the distance metric comprises a weighted combination of the differences.

7. The method of operating a radio receiver device as claimed in claim 5, comprising setting the further gain to be equal to the gain to which a minimum distance metric has been assigned.

8. The method of operating a radio receiver device as claimed in claim 1, comprising deriving the further gain from one or more stored gains subject to a refinement according to a frequency separation and/or time separation between the stored gain and the further gain.

9. The method of operating a radio receiver device as claimed in claim 1, comprising setting the further gain to a value interpolated between two or more stored gains.

10. The method of operating a radio receiver device as claimed in claim 1, wherein the plurality of signals comprises signals transmitted according to an LTE standard.

11. The method of operating a radio receiver device as claimed in claim 10, wherein the plurality of frequencies comprises a plurality of narrowbands defined according to an LTE standard.

12. The method of operating a radio receiver device as claimed in claim 1, comprising disregarding stored gains which were applied at a time before a threshold.

13. The method of operating a radio receiver device as claimed in claim 12, comprising setting the further gain to be equal to a remaining stored gain with a corresponding frequency that is closest to the further frequency.

14. The method of operating a radio receiver device as claimed in claim 12, comprising setting the further gain to be equal to a remaining stored gain that was applied most recently.

15. A radio transceiver device comprising:
   an antenna;
   an amplifier module; and
   a memory;
   wherein the device is configured to:
   receive a plurality of signals with a plurality of corresponding frequencies;
   apply respective gains to each of the plurality of signals using the amplifier; and
   store each gain, its corresponding frequency, and a time at which the gain was applied in the memory;
   wherein the device is configured to receive subsequently a further signal with a further frequency and to apply a further gain to said further signal using the amplifier;
   wherein the further gain is determined using at least one of the stored gains according to a difference between the further frequency and the plurality of corresponding frequencies and according to a comparison between a time at which the further signal is received and at least one of the stored times.

16. The radio transceiver device as claimed in claim 15, which operates according to an LTE standard.

17. The radio transceiver device as claimed in claim 14, wherein the amplifier module comprises an adjustable gain low noise amplifier.

18. The radio transceiver device as claimed in claim 15, further comprising a digital signal processor arranged to optimise the respective gains using automatic gain control.

* * * * *